(12) United States Patent
Chen et al.

(10) Patent No.: US 6,489,622 B1
(45) Date of Patent: Dec. 3, 2002

(54) APPARATUS FOR DECELERATING ION BEAMS WITH MINIMAL ENERGY CONTAMINATION

(75) Inventors: Jin-Liang Chen, Cupertino, CA (US); Linuan Chen, San Jose, CA (US)

(73) Assignee: Advanced Ion Beam Technology, Inc., Sunnyvale, CA (US)

(*) Notice: Subject to any disclaimer, the term of this patent is extended or adjusted under 35 U.S.C. 154(b) by 0 days.

(21) Appl. No.: 09/516,663

(22) Filed: Mar. 1, 2000

(51) Int. Cl.[7] .............................. G21K 5/10; H01J 37/08
(52) U.S. Cl. ................................................ 250/492.21
(58) Field of Search .................................... 250/492.21

(56) References Cited

U.S. PATENT DOCUMENTS

| | | | | |
|---|---|---|---|---|
| 4,634,331 A | * | 1/1987 | Hertel | ......................... 110/180 |
| 4,886,971 A | * | 12/1989 | Matsumura et al. | ........ 250/281 |
| 5,206,516 A | * | 4/1993 | Keller et al. | ............. 250/396 R |
| 5,311,028 A | * | 5/1994 | Glavish | ............... 250/396 ML |
| 5,932,882 A | * | 8/1999 | England et al. | ............. 250/398 |
| 5,969,366 A | * | 10/1999 | England et al. | ........ 250/492.21 |
| 5,981,961 A | * | 11/1999 | Edwards et al. | ............. 250/397 |
| 6,060,715 A | * | 5/2000 | England et al. | ......... 250/396 R |
| 6,111,260 A | * | 8/2000 | Dawson et al. | .......... 250/443.1 |

* cited by examiner

Primary Examiner—Jack Berman
Assistant Examiner—Johnnie L Smith, II
(74) Attorney, Agent, or Firm—Bo-In Lin

(57) ABSTRACT

An ion implantation apparatus is disclosed in this invention. The ion implantation apparatus includes a target chamber for containing a target for implantation and an ion source chamber includes an ion source with a mass filter for generating an ion beam with certain mass and original energy. The ion source chamber further includes beam deceleration optics for decelerating the ion beam from the original energy to the desired final energy. The ion beam apparatus is able to accurately direct low energy ions to a target wafer. The beam deceleration optics further includes a plurality of electrodes for generating an electric field for spreading the charged ion beam over an angular range to accurately control the trajectory paths of ions of different energy levels. The purpose is to eliminate the energy contamination by more accurately controlling the energy range of the charged ions that reach the target for implantation and to block the neutralized particle and ions of higher energy from reaching the target for implantation.

20 Claims, 5 Drawing Sheets

APPARATUS FOR DECELERATING ION BEAMS WITH MINIMAL ENERGY CONTAMINATION

BACKGROUND OF THE INVENTION

1. Field of the Invention

This invention relates generally to ion implantation apparatus used to decelerate ion beams to sub-keV energies. Specifically, this invention relates to an improved deceleration optics system that functions as an energy-filter to allow only charged particles within a particular range of energies to reach the targeted wafers.

2. Background

Ion implantation is a ballastic process used to introduce atoms or molecules, called dopants, to make materials with useful properties. In particular, ion implantation is a common process used in making modern integrated circuits. The amount of ion beam current that can be transported in a conventional ion implanter depends on the ion beam energy and at low energies this beam current becomes unfeasibly low.

For a conventional high current ion implanter, an ion beam is extracted from an ion source and travels through a mass analyzer to select specific ionic species. The selected or filtered ion beam emerges from the magnet and is then incident toward the semiconductor target wafers. The travel distance from the source to the wafers is usually about two meters. For an ion beam with an energy as low as 0.2 keV and beam currents as high as 10 mA, the space charge of the beam is so intense that the ion beam starts to blow up severely as it leaves the source. This problem exists regardless of what kind of beam focusing optics is used. After the ion beam travels about two meters there is not much usable beam current left for implantation. An efficient way to obtain high beam currents at low ion energy is to decelerate an ion beam from higher energy, e.g., 5 keV, to a lower energy, e.g., 1,0.5, or as low as 0.2 keV, at a region close to the wafers. Although the beam may also blow up after deceleration, there is still sufficient beam current remaining for implantation because the distance between the deceleration region and the wafers is usually less than 0.4 meters. With the use of a plasma or electron shower, the beam blow-up will be less and beam transmission can be improved.

The above method is able to achieve high beam currents at energies below 5 keV by extracting ions at a higher than desired final energy, conducting a mass analysis of the ions, and then decelerating the ion beam to the desired energy just before it reaches the target. However, high-energy neutrals can be generated in the region between the mass analyzer and the deceleration electrodes when higher energy ions have charge exchange interactions with residual gases in the beamline. These neutralized atoms will not be decelerated by the decelerating electric fields and will reach the wafers at higher than desired energies. This results in what is known as energy contamination, which causes a deeper than desired dopant depth profile. Energy contamination is only tolerable to ~0.1% in order to provide sufficient margin against shifts in device performance [L. Rubin, and W. Morris, "Effects of Beam Energy Purity on Junction Depths in Sub-micron Devices", Proceedings of International Conference on Ion Implantation Technology, 1996, p96]. To have such a low neutral fraction it requires that the chamber pressures be kept very low (5.0E-7 torr) so as to minimize the probability of charge exchange reactions. This level of pressure is, however, very difficult to maintain under normal operating conditions in an implantation system due to the out-gassing of the photo-resist coating of patterned devices and the presence of feed gases from the source and plasma shower. Another issue is the variation in the level of contamination. Pressure fluctuations during the implant can cause across wafer effects. Day-to-day changes in residual vacuum or photo-resist quality can cause batch-to-batch effects. Finally, the potential loss of wafers worth millions of dollars exists due to these types of undetected vacuum problems.

For all of the above reasons, traditional techniques of ion implantation using conventional deceleration approaches as described above do not provide a viable solution for very low energy ion implantation. There is a need in the art of IC device fabrication to provide new systems to provide very low energy implants with minimal energy contamination. For devices that require shallow p-type and n-type junctions new methods and systems are required to resolve the difficulties and limitations of low energy ion implantation with effective control over energy contamination.

SUMMARY OF THE PRESENT INVENTION

It is the object of the present invention to provide a new ion implant system for very low energy (sub 2 keV) implants to form shallow p-type and n-type junctions in semiconductor devices. The new ion implant system has novel deceleration optics that will enable those of ordinary skill in the art to overcome the problems encountered in the prior art.

Specifically, it is the object of the present invention to present a new ion beam steering deceleration and steering system for decelerating a charged ion beam and for separating the neutralized component, or neutral fraction, from the main ion beam. The charged ion beam is filtered and focused by the ion beam deceleration optics and becomes an angularly spread out beam with an angle of deflection that is dependent on the ion energy. In this way, the ion implant energy can be more accurately controlled and the neutral fraction can be removed. The neutral beam is unaffected by the decelerating electric fields and propagates in the same direction as the initial beam before deceleration. A neutralized-particle stop block then stops the neutrals before reaching the target wafer or target chamber. Energy contamination resulting from neutralized particles incident to the target with higher than desired energies is thus resolved.

The electrodes of the beam deceleration optics are configured to move in a traverse direction relative to the beam line so that the beam can be steered to travel further away from both the neutralized and high-energy particles to assure that only low energy ions are employed for implantation.

Briefly, in a preferred embodiment, the present invention discloses an ion source apparatus for generating and directing an ion beam. The ion source apparatus includes a beam deceleration optics for decelerating and filtering the ion beam. The beam deceleration optics includes a plurality of electrodes for generating an electrostatic field for filtering and spreading out the ion beam over an angular range according to the energy of each ion for more accurately directing a low energy ion to a target wafer.

More specifically, an ion implantation apparatus is disclosed in this invention that includes a target chamber for containing a target for implantation and an ion source chamber that includes an ion source with a mass analyzer for generating an ion beam with specific mass at original energy. The ion source chamber further includes beam deceleration optics for decelerating the ion beam from the original energy to the desired final energy. The ion beam apparatus is able to accurately direct low energy ions to a target wafer. The beam deceleration optics further includes a plurality of electrodes for generating an electric field for spreading the charged ion beam over an angular range to accurately control the trajectory paths of ions of different energy levels. The purpose is to eliminate the energy contamination by more accurately controlling the energy range of the charged ions that reach the target and to block the neutralized particles and ions with higher energy from reaching the target These and other objects and advantages of the present invention will no doubt become obvious to those of ordinary skill in the art after having read the following detailed description of the preferred embodiment, which is illustrated in the various drawing figures.

DETAILED DESCRIPTION OF THE PREFERRED EMBODIMENT

Figure 1:
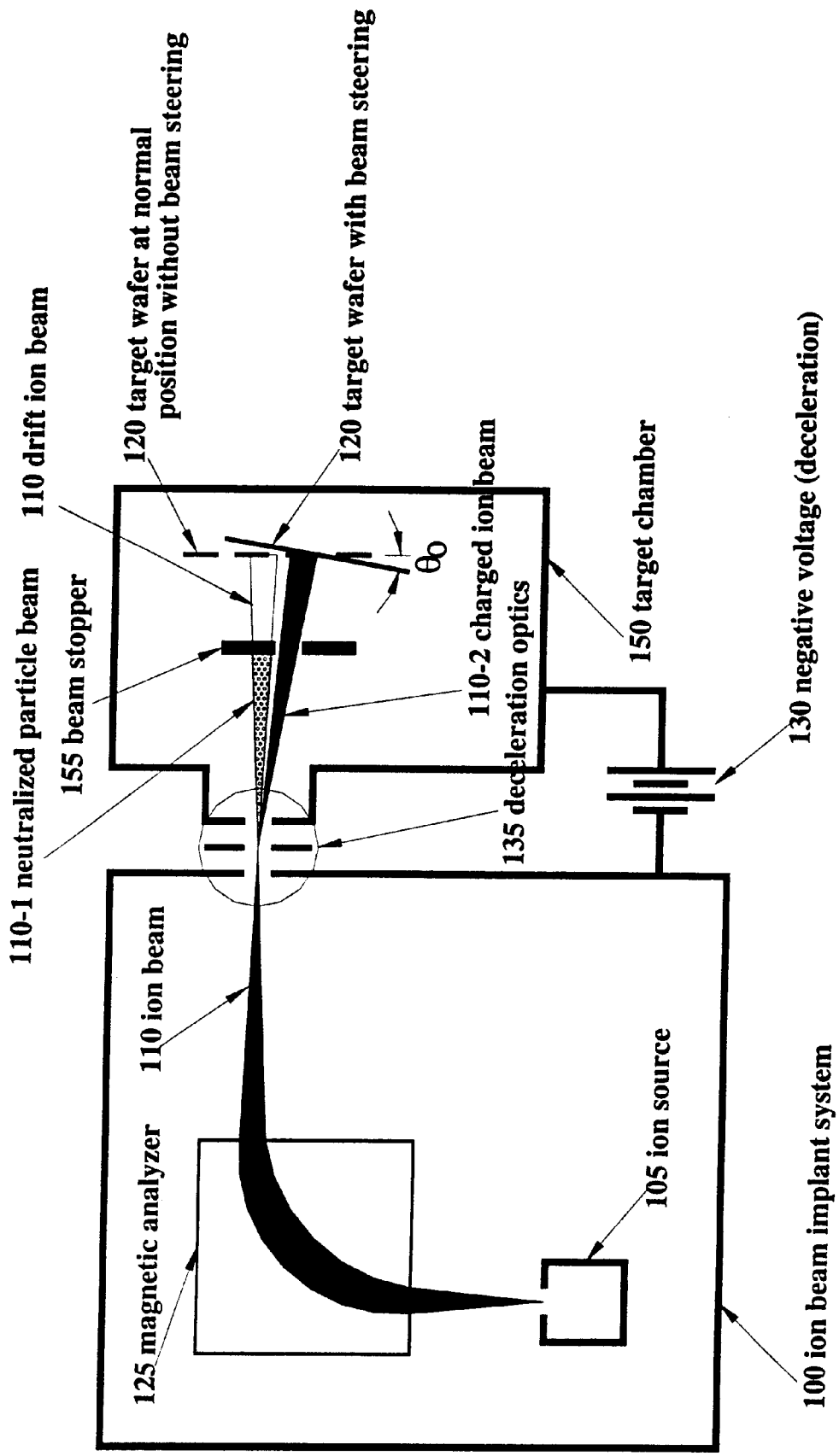
FIG. 1 is a functional block diagram showing how the deceleration optics of this invention separates a decelerated ion beam from the neutralized beam in an ion source implanter system.

FIG. 1 is a functional block diagram for showing the ion implant system 100 of this invention. The deceleration optics described below can decelerate an ion beam from high energy, e.g. 5 keV, to energy as low as 0.2 keV, and at the same time disperse the decelerated ion beam in an angular-spread-out beam according to the ion particle energy range. The angular-spread-out characteristic of the ion beam provides a convenient method for selectively blocking out the beam in a certain energy range by employing a simple mechanical means known as a beam stop. Referring to FIG. 1, the ion beam implant system 100 includes an ion source associated with ion-beam formation electrodes 105, the mass analyzer magnet 125, post analysis deceleration electrodes 135, and target chamber 150 for implanting a target wafer 120 with an ion beam 110.

Under normal operation (no ion beam deceleration), the ion beam 110, mass-filtered by the mass analyzer magnet 125, is transported through the decel electrodes 135 and reaches the wafer. In this situation, there is no voltage difference between the entrance electrode and exit electrode of the decel electrode assembly so that neither deceleration nor acceleration occurs for the ion beam. There is also no non-symmetric field applied in the region of the decel electrodes so that the ion beam is not steered away from the beamline symmetric axis.

Under the operation of ion beam deceleration, after the ion beam 110 passes through the magnetic analyzer 125, a deceleration voltage 130 is applied to decelerate the ion beam 110 as shown in FIG. 1. When the ion beam 110 is a positively charged ion beam, a negative voltage 130 is applied. As the ion beam 110 travels through the ion beam system 100, some charged particles may be neutralized. The deceleration voltage will not decelerate the neutralized particles because they do not carry a net charge. The energy and direction of such particles are not affected by the electric field. After passing through the deceleration optics 135 the path of the neutral particles and the charged particles are therefore separated during deceleration and become two separate beams 110-1 and 110-2. The neutral particle beam 110-1 travels along a straight line while the charged ion beam 110-2 becomes spread out by employing a special deceleration optics as will be discussed below. The charged ion beam becomes an angularly spread-out beam and travels along a path with a slightly downward angle, e.g., a six-degree downward angle, to reach the target wafer 120. Note that the charged ion-beam is spread out over an angular range depending on the energy of the ion particles as will be discussed below. A beam stop 155 is employed on the path of the neutralized particle beam 110-1 to block the neutralized beam 110-1 from reaching the target wafer 120. The target wafer 120 is placed with a small slant angle, e.g., a six-degree angle relative to a vertical direction of the perpendicularly facing charged ion beam 110-2. By putting a beam stop 155 after the deceleration optics, but in the original beam path 110-1, the neutral particles are blocked and hence removed. By making the steering angle sufficiently large (at least 3 degrees) the problem of energy contamination associated with the neutral fraction in charged ion beams can be overcome. In this way, the problem of energy contamination in decel-mode operation can be resolved.

Figure 2:
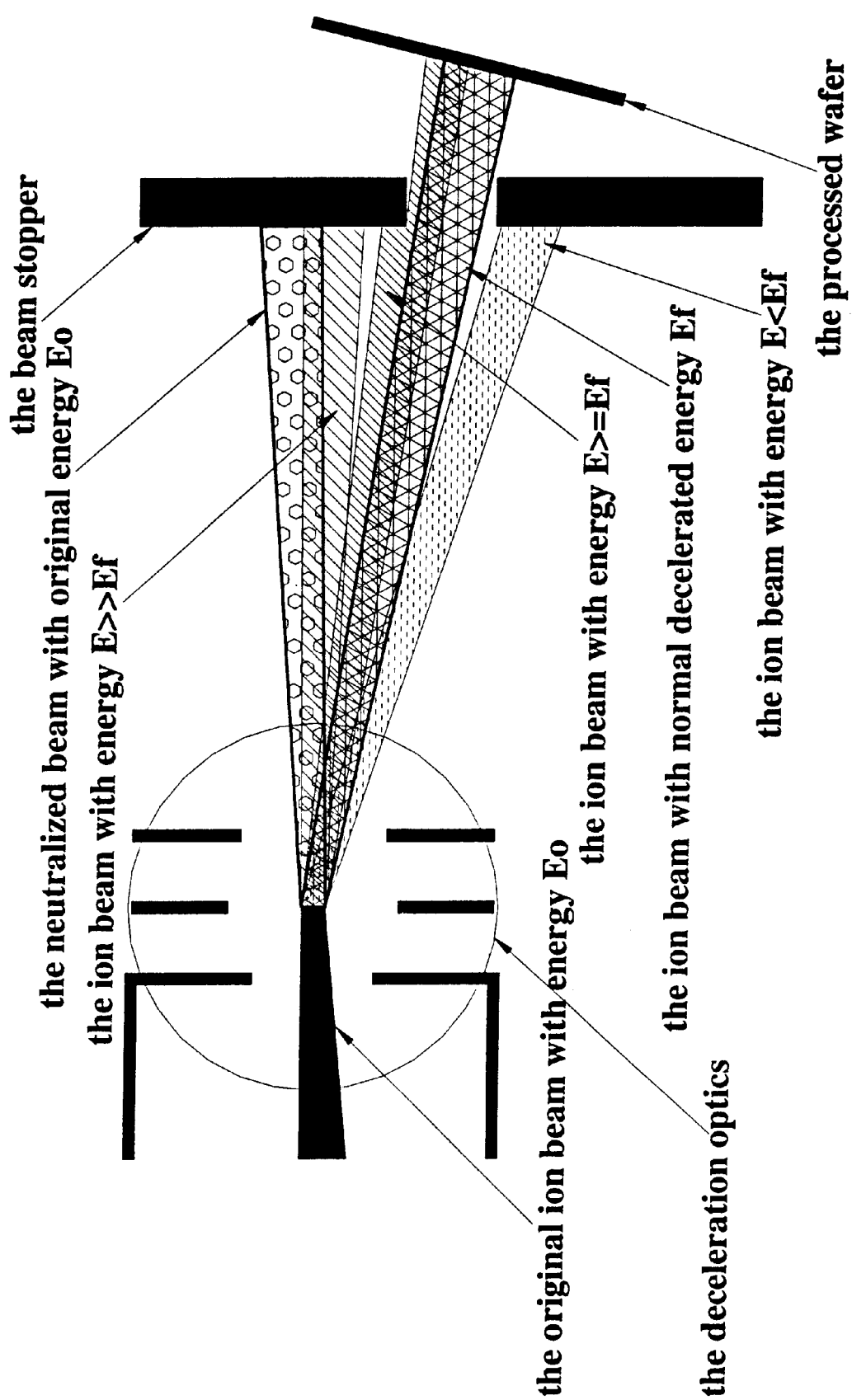
FIG. 2 is a functional block diagram showing how the deceleration optics of this invention acts as an energy filter.

Referring to FIG. 2, the angular spread of the ion beam generated by the deceleration optics provides a steering function that is specifically configured as an energy filter. For a given configuration of the deceleration optics, the individual ions in the beam will be deflected downward at a large (small) angle for ions having a relatively low (high) energy. Suppose that the steering angle is $\theta_O$ for ions with initial energy $E_O$ decelerated to a final energy $E_F$. The ion beam is typically composed of ions with a range of energies from $E_O-dE_1$ to $E_O+dE_2$, where $dE_1$ and $dE_2$ represent the lower and upper ion beam energy increment limits, respectively. Referring to FIG. 2, ions with energy much higher than $E_O$ will be deflected by a small deflection angle $\theta \ll \theta_O$ and thus will be blocked by the upper part of the beam stop as shown in FIG. 2. Ions with higher energy, but close to $E_O$, will be partially blocked. Ions with energy smaller than $E_O$ will be blocked by the lower part of the beam stop although energy contamination is not as serious a problem for ions with energy much less than $E_O$. The problems caused by energy contamination can be significantly resolved with a beam stop 155 as that shown in FIGS. 1 and 2. Even during high voltage glitch conditions, which may cause the original ion beam to have a large energy range, the implant profile will not be adversely affected by energy contamination. The opening of the beam stop also defines the targeted ion-beam direction when the deceleration optics decelerates and steers the ion beam through the opening to the target wafer.

Figure 3:
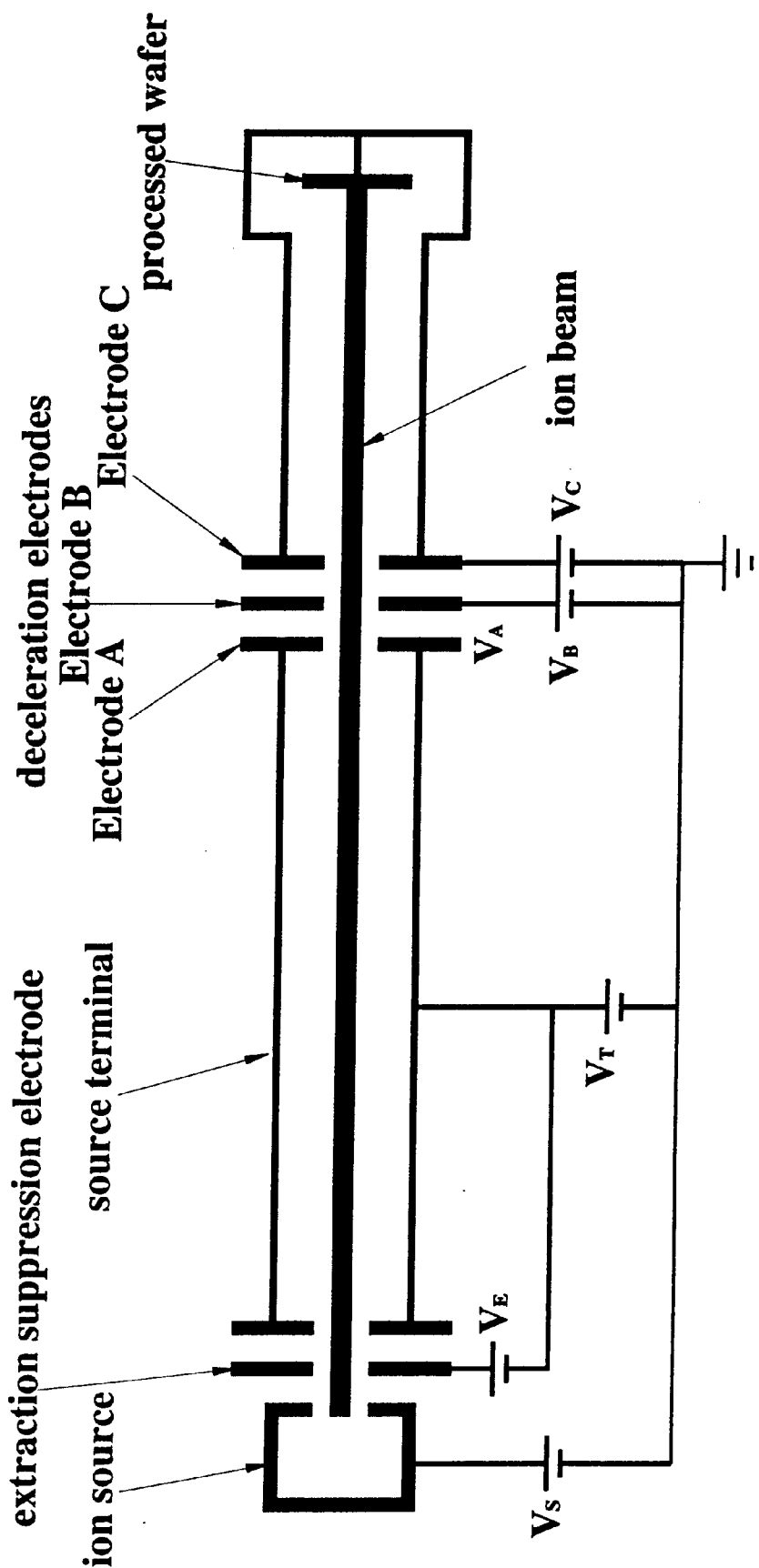
FIG. 3 is a schematic diagram of the major beam line components at different voltages.
Figure 4:
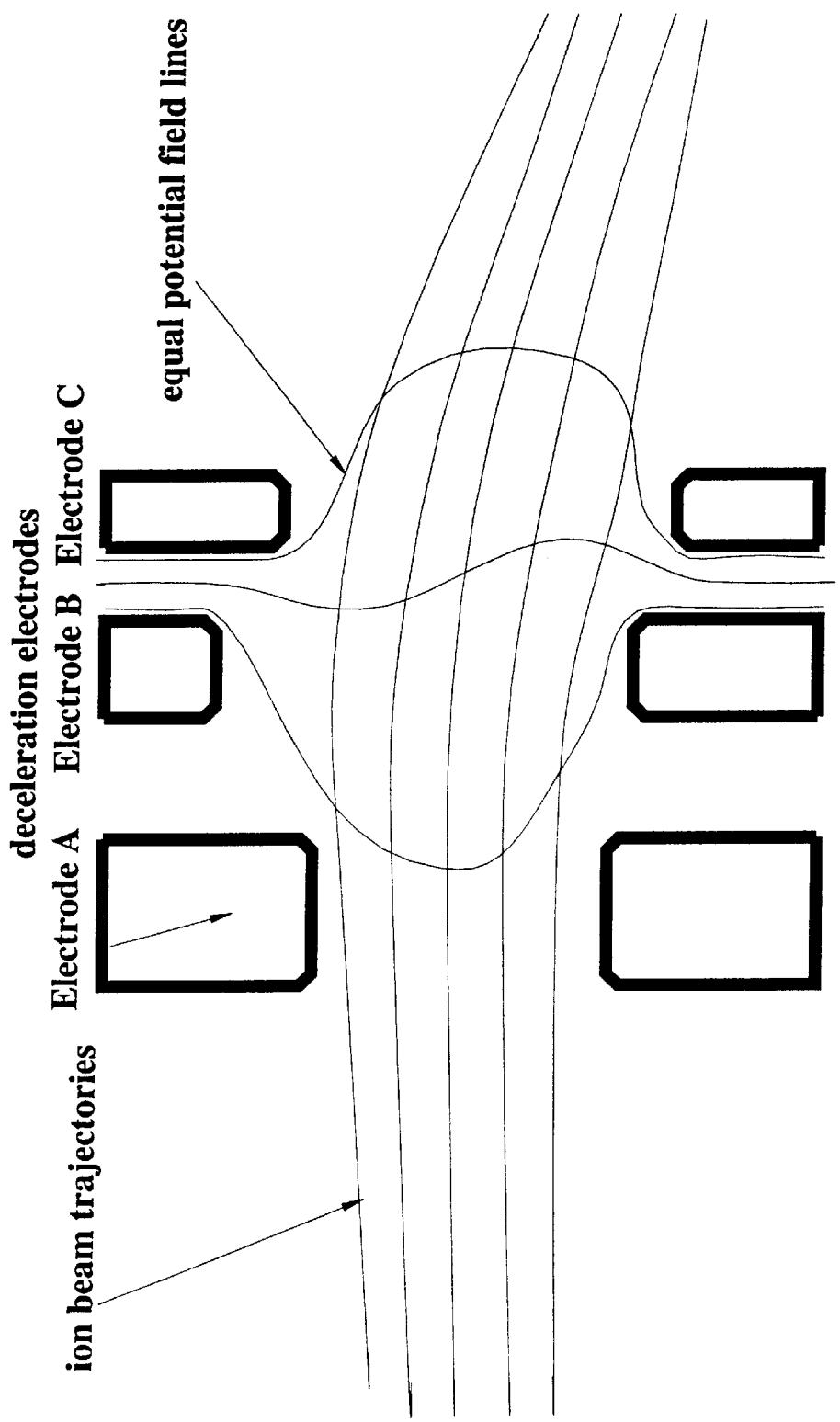
FIG. 4 is the cross-section diagram of the electric field distribution and ion beam trajectories in the deceleration region.

FIGS. 3 and 4 show the schematic diagrams of the deceleration optics 135 and the electrical voltage arrangement of the electrodes employed in the deceleration optics 135 of the present invention. The deceleration optics consists of three electrodes A, B, and C. The voltages of the ion source, the extraction suppression electrode, and the source terminal are shown in FIG. 3 as $V_S$, $V_E$, and $V_T$, respectively, where $V_S$ and $V_T$ are referenced to ground while $V_E$ is referenced on the source terminal. Electrode A is at a potential $V_A$ and is equal to the ion source termination potential $V_T(V_A=V_T)$. The deceleration suppression electrode B is at a potential $V_B$ that is more negative than $V_A$ ($V_B<V_A$). Electrode C is at a potential $V_C$ that is equal to the potential of the processed wafers, and is more positive than $V_A$ ($V_A<V_C$). The original ion energy $E_O$ is equal to $q(V_{S-}V_T)=q(V_{S-}V_A)$, and the decelerated ion energy $E_F$ is equal to $q(V_S-V_A)-q(V_C-V_A)=q(V_S-V_C)$, where q is the charge of an ion in the beam and is usually positive.

In most ion implanters, it is preferable for the processed wafers to be connected to ground ($V_C=0$) or nearly so. In this configuration, the ion source power supply is floated or referenced on the source terminal potential which itself is floated or referenced on the ground potential. The resulting energies are, $E_O=q(V_S-V_T)$, $E_F=qVs$, where, $V_C=0$, $V_B<0$, and in decel-mode, $V_T<0$. Also, the extraction power supply, $V_E<0$, is referenced on the source terminal and $V_B<V_A=V_T<0$ is referenced on the ground potential.

Regardless of the configuration, $V_B$ is more negative than $V_A$ and $V_C$ ($V_B<V_A<V_C$), so that Electrode B can suppress both the upstream and downstream electrons. Electrode B also provides focusing while the beam is being decelerated and steered. From the electrode cross-section diagram in FIG. 4, it can be seen that Electrode B and Electrode C can be displaced transversely off the centerline of electrode A. Both the electric field between Electrode A and B and the field between Electrode B and C steer the ion beam downward. Electrodes B and C are controlled by a manipulator and can move transversely to steer the ion beam with the correct angle so that the ion beam can reach the wafer position. The steering angle is a function of the original and final energies of the ion beam and the electric field distribution in the deceleration region. For different original and final energies of the ion beam, the parameters affecting the electric field distribution, including the suppression voltage $V_B$ and the transverse positions of Electrodes B and C, have to change to keep the steering angle unchanged so that the ion beam can reach the same wafer position. Because the suppression voltage $V_B$ is primarily used to focus the ion beam, its value is usually changed to give the proper focusing while the transverse positions of Electrodes B and C are changed to give the proper steering.

The original beam is required to have small beam width for separating the decelerated and steered ion beam with the neutralized beam in a position not far from the deceleration region to significantly reduce energy contamination. Assume that the steering angle is $\theta_O$, the beam width is w for both the neutralized beam and decelerated ion beam, and the travel distance for completely separating the neutralized beam and the steered ion beam is L. The steering angle $\theta_O$ should be maintained small, usually from three degrees to fifteen degrees, to minimize corresponding wafer position change and possible beam current loss. The travel distance L should be short to maximize beam current delivery to the wafer when space charge blow-up occurs for low energy and high current beam. Since the relation among these parameters is approximately $w=L \tan\theta_O$, the beam width is required to be small, too. For instance, when $\theta_O$ is equal to 6 degrees and L equal 30 cm, w will become 3.2 cm Considering that large beam cross section is required to minimize space charge blow-up for low energy and high current beam, the beam height should be large when the beam width is limited to be small. In other words, an ion beam with large aspect ratio (or large height-to-width ratio) is required in the deceleration and steering region for successfully separating the decelerated and steered ion beam from the neutralized beam, and transporting the production worthy low energy beam currents. An aspect ratio of 4 is considered to be the minimum requirement for separation of a low energy and high current ion beam from the corresponding neutralized beam. Since the beam width is usually larger than 2.5 cm, the beam height has to be at least 10 cm. After the neutralized beam is separated from the decelerated ion beam, a beam stop can be applied in the neutralized beam path to prevent the neutrals with higher energy from reaching the wafer and therefore minimize energy contamination.

Figure 5:
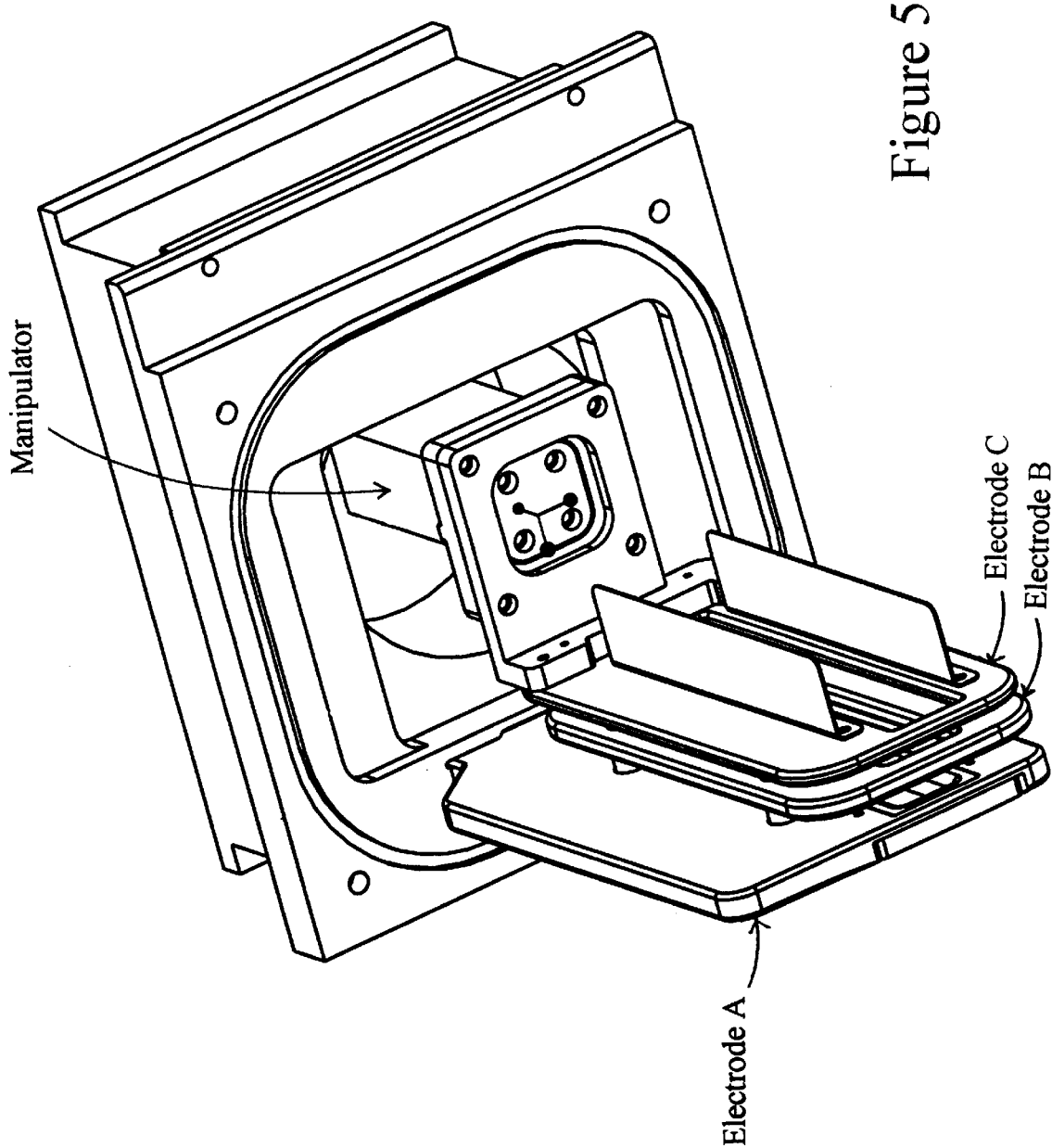
FIG. 5 is a three-dimensional perspective view of the mechanical design of the deceleration electrode assembly.

FIG. 5 shows a three-dimensional perspective view of the mechanical design of the deceleration electrode assembly. The apertures of the three electrodes are narrow and tall because they are designed to decelerate narrow and tall beams, or high aspect ratio beams as discussed above. Electrode B has a larger width than Electrode A and C to prevent ion beams from striking on Electrode B, generating large secondary electron emissions, and thereby overloading the suppression power supply. Another reason is to provide a better focusing field distribution. When the width of Electrode B is smaller than that of Electrode C, the transverse field components at the edge of Electrode C is high, which may inappropriate deflection of the beam.

The deceleration optics of the present invention provides an apparatus to decelerate ion beams and at the same time steer these decelerated beams off the path of the original ion beams. In this way, the decelerated ion beam is steered in the target direction and the neutralized beam travels in the direction of the original ion beam. By blocking the neutralized beams with a beam stop, the energy contamination resulting from deceleration can be eliminated.

The invention thus discloses an ion implantation apparatus, which includes a target chamber for containing a target for implantation and an ion source chamber includes an ion source for generating an ion beam. The ion source chamber further includes beam deceleration optics for decelerating the ion beam to produce a low energy ion beam. The deceleration optics further includes an ion beam steering means for generating an electrostatic field for separating neutralized particles by steering the charged particles to transmit in a targeted charged-particle direction that is slightly different from the neutral beam direction. The ion-beam deceleration optics further includes electrodes for generating a spread-out ion beam over an angular range along the beam line of the ion beam. The angular spread is determined by the energy of each ion in the ion beam and is used for more accurately controlling the energy of the ions for implantation and for blocking the neutralized particles and ions above a maximum implant energy from reaching the target for implantation. In a preferred embodiment, the ion-beam deceleration optics includes a first, second, and third electrode arranged along the direction of the ion beam for generating a filtering electric field wherein the second electrode is provided with a more negative voltage than the first electrode, and the third electrode is provided with a more positive voltage than the first electrode. In a preferred embodiment, the first electrode is provided with a voltage that is the same as the ion source terminal voltage and the third electrode is provided with a voltage that is the same as a wafer voltage. In another preferred embodiment, the third voltage is provided with a wafer voltage connected to a ground voltage. The ion-beam deceleration optics further includes a neutral beam blocking means for blocking the neutralized particles from reaching the target of implantation in the target chamber. The beam deceleration optics further includes a high energy beam blocking means for blocking ions of the ion beam having an energy higher than a maximum implant energy by placing the high energy beam blocking means at a pre-designated angular position along the beam line corresponding to an angular range for blocking ions of the ion beam having an energy higher than the maximum implant energy. The ion source generates a positively charged ion beam and the beam deceleration optics includes the electrodes for generating an energy filtering electric-field for decelerating and filtering the ion beam by producing a spreading-out ion beam over an angular range along the primary beam direction. The steered ion beam transmits in the targeted ion-beam direction having a small vertically deflected angle, e.g. six degrees, relative to a horizontal axis as shown in FIGS. 1 and 2. And, the target chamber containing the target for implantation leans at a small angle, e.g. six-degrees, relative to a vertical axis perpendicular to the horizontal axis whereby the target for implantation is perpendicular to the incident angle of the ion beam. In another preferred embodiment, the ion source chamber is provided with a vacuum in the range of $10^{-5}$ torr and the ion beam may be decelerated to an energy level of 200 eV or less with a beam energy contamination of about 0.1%.

In summary, an ion source apparatus for generating and directing an ion beam is disclosed in this invention. The ion source apparatus includes a beam deceleration optics used for decelerating the ion beam. The beam deceleration optics further includes a plurality of electrodes for generating an electric field used for spreading out the ion beam over an angular range according to energy of each ion of the ion beam for more accurately directing an ion beam with desired low energy to a target wafer.

According to above descriptions, this invention further discloses a method for generating an implantation ion beam. The method includes the steps of (a) providing an ion source for generating an ion beam; (b) employing an analyzer magnet for steering the ion beam through a curved beam-trajectory to a targeted ion-beam direction; (c) applying the ion beam steering means for coordinating with the beam deceleration means for generating an electromagnetic field for separating a neutralized particle by steering a neutralized particle to transmit in a neutralized-particle direction slightly different from the targeted ion-beam direction; and (d) employing a beam deceleration optics for decelerating and filtering the ion beam for producing a spreading out beam over an angular range along a beam line of said ion beam according to an energy of ions of the ion beam and employing a high energy ion blocking means for blocking out ions having an energy higher than a maximum implant energy.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. An ion implantation apparatus comprising:

a target chamber for containing a target for implantation and an ion source chamber includes an ion source for generating an ion beam;

said ion source chamber further includes a beam deceleration means for decelerating said ion beam for producing a low energy ion beam;

said beam deceleration means further includes a beam steering means for generating an electrostatic field for separating neutralized particles by steering charged particles to transmit in a targeted ion-beam direction slightly different from a direction of said neutralized-particles; and an ion-beam deceleration optics further includes a plurality of electrodes disposed immediately in front of said target chamber for filtering charged particles of said ion beam for generating a spread-out ion beam over an angular range along a beam line of said ion beam according to an energy of each ion of said ion beam for more accurately controlling said energy of said ions for implantation by blocking said neutralized particles and said ions above a maximum implant energy projected as part of said spread-out ion beam from reaching said target for implantation while allowing a remaining portion of said spread-out ion beam below said maximum implant energy to reach said target.

2. The ion implantation apparatus of claim 1 wherein:

said ion-beam deceleration optics includes a first, second and third electrodes arranged in sequence along an incident direction of said ion beam for generating an ion-beam filtering electric field wherein said second electrode is provided with a more negative voltage than said first electrode and said third electrode is provided with a more positive voltage than said first electrode for generating said spread-out ion beam to project into said target chamber.

3. The ion implantation apparatus of claim 2 wherein:

said first electrode is kept stationary while second and third electrodes are arranged to move transversely along a dispersive plane defined by an analyzer magnet, to generate a non-symmetric electric field to steer said ion beam to said target ion beam direction for generating said spread-out ion beam to project into said target chamber.

4. The ion implantation apparatus of claim 2 wherein:

said first and second electrodes are kept stationary while said third electrode is arranged to move transversely along a dispersive plane defined by an analyzer magnet, to generate a non-symmetric electric field to steer said ion beam to said target ion beam direction for generating said spread-out ion beam to project into said target chamber.

5. The ion implantation apparatus of claim 2 wherein:

said first and third electrodes are kept stationary while said second electrode is arranged to move transversely along a dispersive plane defined by an analyzer magnet, to generate a non-symmetric electric field to steer said ion beam to said target ion beam direction for generating said spread-out ion beam to project into said target chamber.

6. The ion implantation apparatus of claim 2 wherein:

said first, second, and third electrodes disposed immediately in front of said target chamber each having a narrow and tall aperture opening with height greater than 10 cm, and each having a height-to-width ratio larger than 4.

7. The ion implantation apparatus of claim 2 wherein:

said second electrode having a width larger than a width of said first and third electrodes to minimize a suppression current overload on said second electrode due to a bombardment of said ion beam for generating said spread-out ion beam to project into said target chamber.

8. The ion implantation apparatus of claim 2 wherein:

said first electrode is provided with a voltage same as an ion source terminal voltage and said third electrode is provided with a voltage same as a wafer voltage for generating said spread-out ion beam to project into said target chamber.

9. The ion implantation apparatus of claim 3 wherein:
said third electrode is provided with a wafer voltage connected to a ground voltage for generating said spread-out ion beam to project into said target chamber.

10. The ion implantation apparatus of claim 1 further comprising:
a neutralized beam blocking means for blocking said neutralized particle from reaching said target of implantation in said target chamber.

11. The ion implantation apparatus of claim 1 further comprising:
a high energy beam blocking means for blocking ions of said spread-out ion beam having an energy higher than a maximum implant energy by placing said high energy beam blocking means at an pre-designated angular position corresponding to an angular range for blocking ions of said spread-out ion beam having an energy higher than said maximum implant energy.

12. The ion implantation apparatus of claim 1 further comprising:
a low energy beam blocking means for blocking ions of said spread-out ion beam having an energy lower than a minimum implant energy by placing said low energy beam blocking means at an pre-designated angular position corresponding to an angular range for blocking ions of said spread-out ion beam having an energy lower than said minimum implant energy.

13. The ion implantation apparatus of claim 10 further comprising:
a high energy beam blocking means for blocking said neutralized particles and ions of said spread-out ion beam having an energy higher than a maximum implant energy;
a low energy beam blocking means for blocking ions of said spread-out ion beam having an energy lower than a minimum implant energy; and
said high energy blocking means and low energy blocking means are disposed at opposite end having a gap for defining a beam opening for allowing ions of said spread out beam with energy between said maximum and minimum implant energy to project toward said target for implantation.

14. The ion implantation apparatus of claim 13 wherein:
said high energy blocking means and low energy blocking means are disposed in parallel on a same plane have a non-perpendicular incline angle relative to a projection direction of said neutralized particles.

15. The ion implantation apparatus of claim 11 wherein:
said target for implantation disposed behind said high energy blocking means with a small inclined angle relative to said high energy blocking means and oriented substantially perpendicular to said spread out ion beam projected thereto.

16. The ion implantation apparatus of claim 1 wherein:
said ion source is an ion source for generating a positively charged ion beam and said beam deceleration optics disposed immediately in front of said target chamber includes said electrodes for generating a negative energy filtering electric-field for decelerating and filtering said ion beam for producing a spread-out ion beam over an angular range along said beam line of said ion beam.

17. The ion implantation apparatus of claim 1 wherein:
said ion beam deceleration optics includes a steering means for steering said ion beam carrying electric charges to transmit in said targeted ion-beam direction having a small vertically deflected angle of three to fifteen degrees along a dispersive plane defined by an analyzer magnet; and
said target chamber containing said target for implantation tilts at a small angle of three to fifteen degrees relative to a neutralized beam projection direction whereby said target of implantation is perpendicular to said spread out ion beam projected thereto.

18. The ion implantation apparatus of claim 1 wherein:
said ion source chamber is provided with a vacuum in the range of $10^{-5}$ torr and said ion beam is decelerated to an energy levels of 200 eV or lower for reducing a beam contamination.

19. An ion source apparatus for generating an implantation ion beam comprising:
a beam deceleration optics for decelerating and filtering said ion beam
said beam deceleration optics further includes a plurality of electrodes for generating an electrical field for expanding and spreading out said ion beam over an angular range according to an energy of each ion of said ion beam for blocking a high energy portion of said spread out ion beam and projecting a low energy portion of said spread out ion beam to a target wafer.

20. A method for generating an implantation ion beam comprising:
(a) providing an ion source for generating an ion beam;
(b) employing an analyzer magnet for steering said ion beam through a curved beam-trajectory to a targeted ion-beam direction;
(c) applying said ion beam steering means for coordinating with said beam deceleration means for generating an electromagnetic field for separating a neutralized particle by steering a neutralized particle to transmit in a neutralized-particle direction slightly different from said targeted ion-beam direction; and
(d) employing a beam deceleration optics for decelerating and filtering said ion beam for producing a spreading out beam over an angular range along a beam line of said ion beam according to an energy of ions of said ion beam and employing a high energy ion blocking means for blocking out ions having an energy higher than a maximum implant energy for projecting a low energy portion of said spreading out beam as said implantation ion beam to a target for implantation.

* * * * *